US005587960A

United States Patent [19]
Ferris

[11] Patent Number: 5,587,960
[45] Date of Patent: Dec. 24, 1996

[54] INTEGRATED CIRCUIT MEMORY DEVICE WITH VOLTAGE BOOST

[75] Inventor: Andrew Ferris, Milan, Italy

[73] Assignee: SGS-Thomson Microelectronics Limited, Bristol, United Kingdom

[21] Appl. No.: 558,323

[22] Filed: Nov. 15, 1995

[30] Foreign Application Priority Data

Nov. 15, 1994 [GB] United Kingdom ................ 9423038

[51] Int. Cl.$^6$ ........................................................ G11C 8/00
[52] U.S. Cl. ............................. 365/230.03; 365/230.06; 365/189.02
[58] Field of Search ........................ 365/226, 189.02, 365/189.01, 189.11, 185.23, 230.06, 230.03, 185.13, 185.11

[56] References Cited

U.S. PATENT DOCUMENTS

| | | | |
|---|---|---|---|
| 4,977,538 | 12/1990 | Anami et al. | 365/230 |
| 5,255,224 | 10/1993 | Galbi et al. | 365/189.09 |
| 5,361,237 | 11/1994 | Chishiki | 365/189.01 |
| 5,406,526 | 4/1995 | Sugibayashi et al. | 365/230.03 |
| 5,416,748 | 5/1995 | Fujita | 365/189.08 |

OTHER PUBLICATIONS

1992 Symposium On VLSI Circuits Digest of Technical Papers, 1992, pp. 112–113, Noda, et al., "A Boosted Dual Word Line Decoding Scheme For 256MB Drams".

IEICE Transactions on Electronics, vol. E75C, Nov. 1992 Tokyo JP, pp. 1323–1332, Ooishi, et al. "A St (Stretchable Memory Matrix) Dram With Multivalued Addressing Scheme".

IBM Technical Disclosure Bulletin, vol. 30, No. 5, Oct. 1987, New York, US, pp. 378–379, "OWRD Line Segmenting With Two–Dimensional Decoding".

IBM Technical Disclosure Bulletin, vol. 26, No. 12, May 1984, New York, US, pp. 6652–6653, Ellis, "Decoded Isolation Device For Decoders".

Primary Examiner—Tan T. Nguyen
Attorney, Agent, or Firm—David M. Driscoll; James H. Morris

[57] ABSTRACT

An integrated circuit memory device is provided with a voltage boost facility. The voltage boost facility is used with a so-called divided wordline architecture, in which a wordline is divided into independently addressable sub-wordlines.

17 Claims, 8 Drawing Sheets

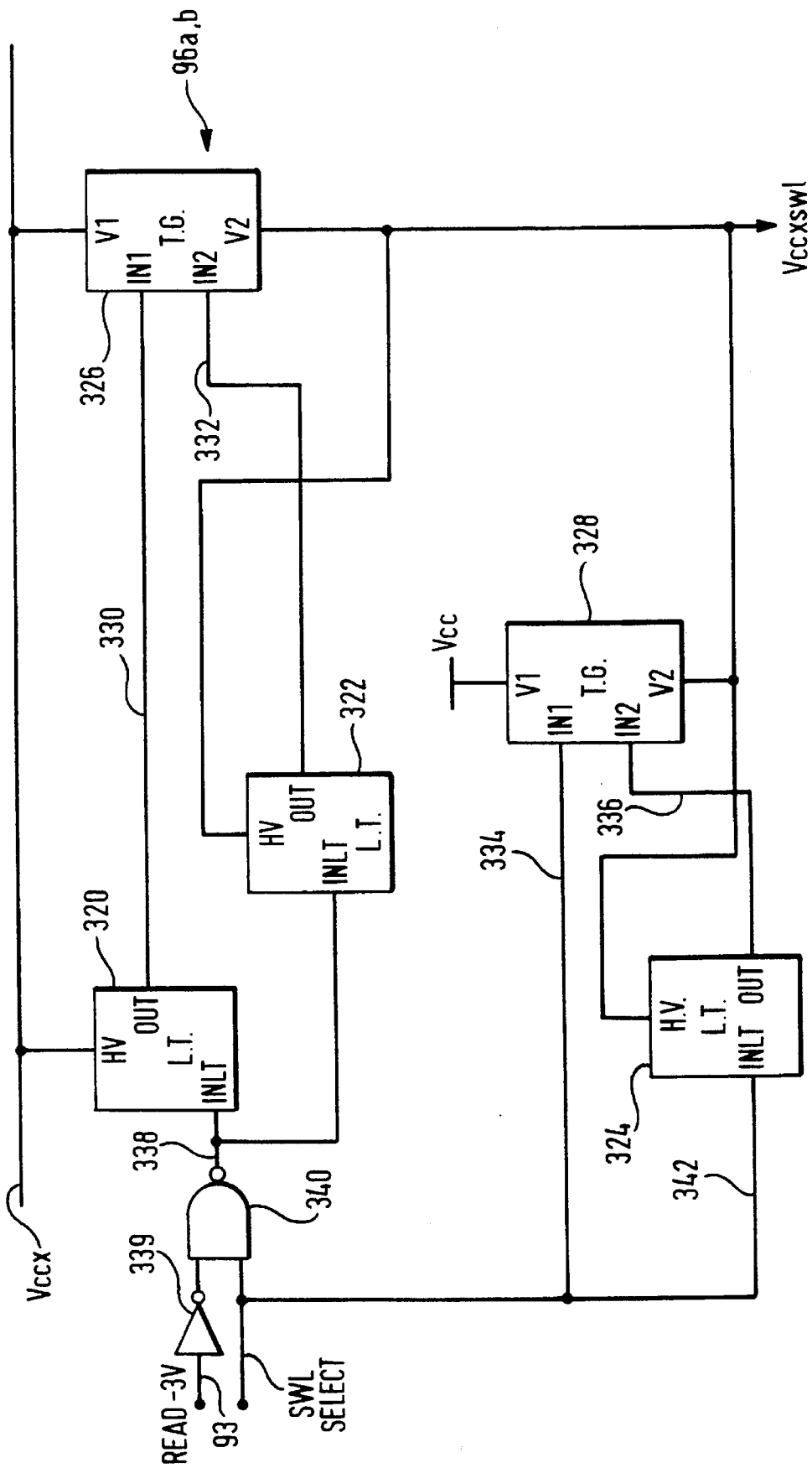

INTEGRATED CIRCUIT MEMORY DEVICE WITH VOLTAGE BOOST

FIELD OF THE INVENTION

The present invention relates to an integrated circuit memory device with a voltage boost facility.

BACKGROUND OF THE INVENTION

Integrated circuit memory devices are made which can operate with different power supply voltages. For example, a typical memory chip can operate with a power supply voltage of 5 V±10% or with a power supply voltage of 3.3 V±0.3 V. For an integrated circuit memory device which includes non-volatile single floating gate transistor memory cells which are to be programmed or erased, or read, it is necessary for certain read operations to provide a voltage of approximately 5 V to the gates of the cells. A voltage of about 5 V is sufficient to deliver enough cell current for reliable sensing in cells having an erase threshold voltage of about 3 V which is the highest practical maximum in existing floating gate transistor cells in non-volatile memories. Where the power supply voltage is 5 V, the necessary voltage required for reading can be derived directly from the power supply itself. However, where the power supply voltage is nominally 3.3 V, it is necessary to boost this voltage up to a value in excess of 4 V and preferably about 5 V for the required read operations. This can be done by a voltage boost circuit or a pump circuit. Voltage boost circuits are known and are not discussed in detail herein. They include a boot capacitor across which the output boosted voltage is provided. The boosted level is determined by the ratio of the boot capacitor to the amount of capacitance which is connected on the supply line on which the voltage is to be boosted. If this capacitance can be reduced, then the size of the boot capacitor can be reduced to maintain the ratio thus give the same boosted level. This gives an advantage in a reduction of chip area, time taken to boost the supply voltage, power and on-chip noise generated by the circuit.

Pump circuits are also known and are not discussed further herein. Briefly, a pump circuit relies on several capacitively coupled stages, isolated by diodes, to progressively raise the voltage to the required level. These stages are driven by non-overlapping clocks. A reduction of the capacitance to be raised is also advantageous for these circuits.

In an existing memory array, the power supply line to be boosted is connected to all the cells in a row of the memory and to the peripheral circuits for driving the wordlines. Thus, there is a significant amount of capacitance connected to the supply line when the supply voltage is boosted. The present invention seeks to reduce the capacitance connected to the power supply line when the supply voltage is boosted in order to overcome these problems.

Random access memories (RAM) having so-called divided wordline (DWL) architectures are known, in which a wordline is divided into independently addressable sub-wordlines. This improves memory speed by avoiding long wordlines and the associated larger resistances and capacitances. It would be desirable to use DWL architecture in so-called flash memories, that is memories made up of electrically erasable and programmable single floating gate transistor cells, to utilise its speed advantages. However, in these memories, problems arise in routing different voltage levels to the gates of the cells and keeping sub-wordline drive circuits relatively simple and hence small. It will be appreciated that there is a trade-off between improvement in speed using a DWL architecture and area consumed by the required sub-wordline drive circuits. Problems associated with routing different voltages to the gates of the cells are compounded when the voltage supply level has to be increased by pumping or boosting. Furthermore, sub-wordline drive circuits increase the capacitance on the voltage line to be boosted.

SUMMARY OF THE INVENTION

According to the present invention there is provided an integrated circuit memory device comprising:

- a memory array comprising a plurality of memory cells arranged in rows and columns, the cells in a row of a sector being arranged in sectors with the cells in each sector being connected to a common respective sub-wordline and cells in a column being connected to a common bit line;
- a plurality of sub-wordline drive circuits associated respectively with said sub-wordlines and connected to supply a cell voltage to their associated sub-wordline;
- voltage raising circuitry for raising a power supply voltage connected on a memory voltage supply line to said cell voltage;
- row addressing circuitry for selecting one of the sub-wordlines in one of said sectors; and
- control circuitry for selectively disconnecting from said memory voltage supply line sub-wordline drive circuits associated with sub-wordlines in non-selected sectors.

Normally, each sector will contain a plurality of sub-wordlines, and one or more groups of sub-wordline drive circuits.

Preferably the control circuitry comprises a plurality of voltage control switches, each voltage control switch being associated with a group of sub-wordline drive circuits for applying said cell voltage to a group of sub-wordline drive circuits when a sub-wordline associated with a sub-wordline drive circuit in that group is selected.

Each voltage control switch can be made responsive to a SECTOR ENABLE signal so that it can be disabled when the sub-wordline drive circuit or sub-wordline drive circuits associated with that voltage switch are not selected.

When disabled, the voltage control switch can connect the group of sub-wordline drive circuits to the power supply voltage.

The integrated circuit memory device can include a plurality of main wordlines extending in the row direction, each main wordline being connected to a plurality of sub-wordline drive circuits in the column direction.

In that case, the row addressing circuitry comprises a main wordline decode circuit for selecting one of said plurality of main wordlines and a sub-wordline decode circuit for selecting a group of said sub-wordline drive circuits.

There is preferably a sub-wordline decode circuit associated with each of said sectors.

In a particularly advantageous embodiment, the sub-wordline drive circuits connected to each main wordline and extending in the column direction can be arranged in an interleaved fashion with sub-wordline drive circuits associated with alternate sub-wordlines being located on opposite sides of said sector of cells. This relaxes the pitch of the sub-wordline drive circuits and therefore eases layout problems in fitting in the required number of sub-wordline drive circuits. In this architecture, there can be one voltage control switch associated with the group of sub-wordline drive circuits on each side of each sector of cells. This arrangement also further reduces the capacitance connected to the supply line.

In one embodiment, the voltage raising circuitry comprises a single voltage boost circuit and a boost capacitor connected between the voltage boost circuit and a common memory voltage supply line. When the voltage boost circuit is active, the boost capacitor increases the voltage on said common memory voltage supply line above the power supply voltage. In this embodiment the boost capacitor extends across the width of the memory array to minimise RC delays on the boosted node.

In an alternative embodiment, the voltage raising circuitry comprises a plurality of voltage boost circuits and associated boost capacitors, wherein each sector of cells has associated therewith at least one voltage boost circuit and a boost capacitor. In that case, each boost capacitor is connected between its voltage boost circuit and a group of sub-wordline drive circuits of said sector. It will be appreciated that in this embodiment, the single capacitor extending widthwise of the array in the previous embodiment has been replaced by a plurality of individual capacitors, appropriately resized. The control circuitry is operative to connect the power supply voltage to the boost capacitor of selected sectors thereby to permit said boost capacitor to supply said cell voltage to a sub-wordline drive circuit of a selected sub-wordline.

In the previous embodiment, the capacitance of all the control circuitry is connected to the supply line during boosting and this can be a large proportion of the total capacitance. This is eliminated in this alternative embodiment.

Sector switches can also be provided for selectively applying a boosted power supply voltage to reference circuits which are associated with sense circuitry of each sector.

The provision of the control switches and sector switches enables the capacitance associated with the voltage boost circuit to be minimised by connecting to the voltage boost circuit only those elements which are intended to receive the boosted power supply voltage and disconnecting other elements from the line on which the voltage is to be boosted. In the aforementioned alternative embodiment there is a further improvement in reducing capacitance by not having all the control circuitry connected to the line to be boosted.

Another advantage of the so-called DWL architecture when applied to flash memories arises during programming of the memory, when the gates of all cells connected to a wordline are taken to the programming voltage of 12 V. The effect of this is to increase the threshold voltages of erased cells. In a DWL architecture, sub-wordlines are only active on a per sector basis and therefore cells are subject to far less stress throughout the lifetime of the part. In a non-DWL architecture, means have to be provided to relieve this stress in non-selected sectors.

For a better understanding of the present invention and to show how the same may be carried into effect reference will now be made by way of example to the accompanying drawings.

BRIEF DESCRIPTION OF THE DRAWINGS

FIG. 9 is a block diagram of a control switch for the second embodiment of the invention;

DESCRIPTION OF THE PREFERRED EMBODIMENT

Figure 1:
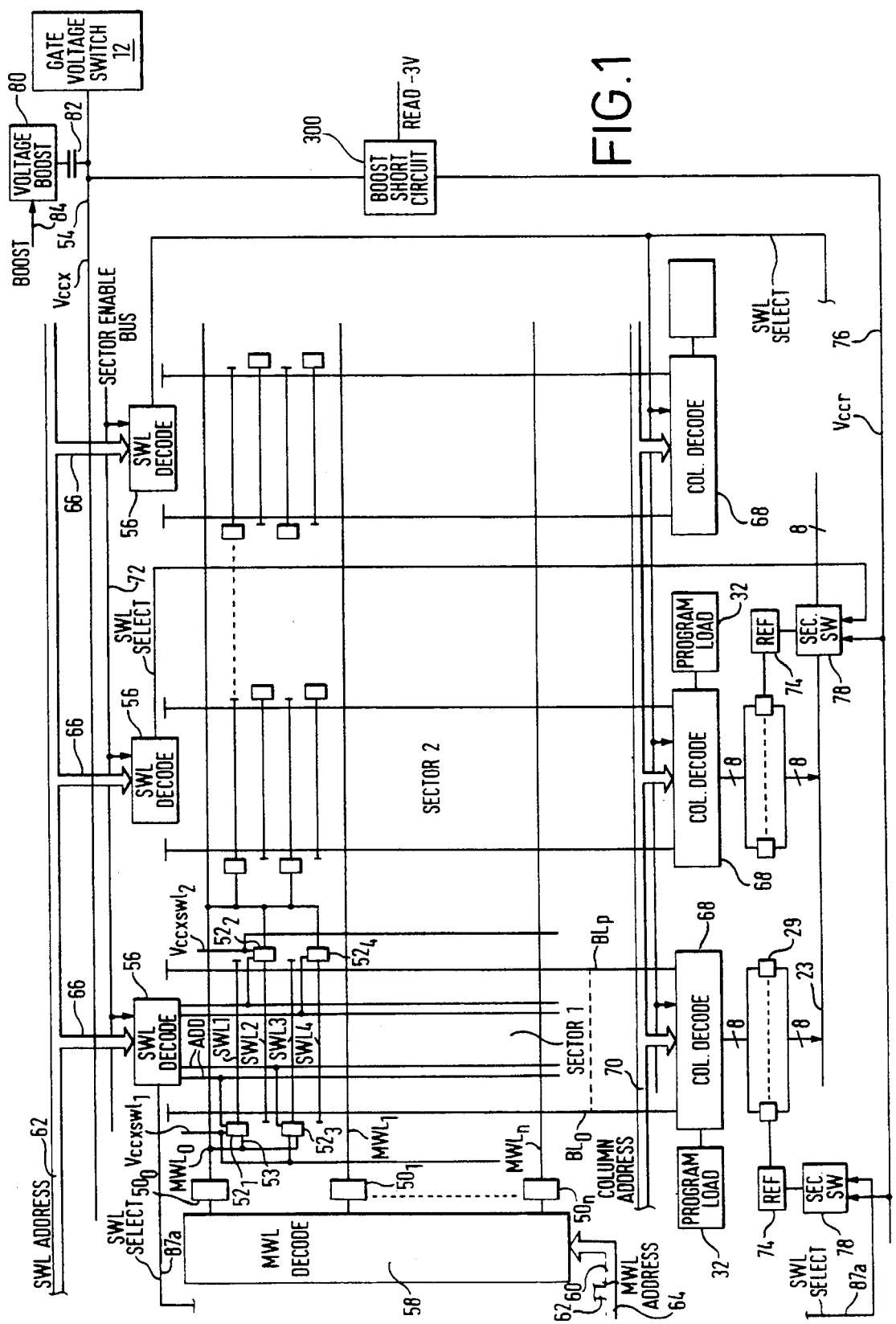
FIG. 1 is a block diagram showing the main elements of a flash memory circuit.

FIG. 1 is a schematic diagram of a flash memory array. The array consists of a plurality of memory cells extending in rows and columns. The array comprises a plurality n of main wordlines MWL0 to MWLn. Each main wordline extends along the full width of the memory array in the row direction. The memory array also comprises a plurality of bit lines. The array is divided into sectors, each sector including a plurality of columns of cells, each column of cells being connected to a respective bit line. Each sector has a plurality p of columns and a corresponding plurality p of bit lines which are denoted BL0 to BLp for the first sector SECTOR 1 of the array shown in FIG. 1. A sub-wordline extends along the width of one sector and is connected to all cells in a row of the sector, in this case p cells. There is a plurality of sub-wordlines extending across the array equal to the number of sectors, each sub-wordline being addressable independently of other sub-wordlines in the same row. This is a so-called divided wordline (DWL) architecture. In addition, in the array of FIG. 1, each main wordline is associated with four sub-wordlines defining respectively four rows of the sector. These are denoted SWL1,SWL2,SWL3 and SWL4 for the first sector SECTOR 1 shown in FIG. 1. Thus, the main wordline runs on a pitch of four cells, that is there are four cells column wise between each main wordline. The pitch of the main wordline is not critical to the present invention and any suitable pitch could be selected, subject to limitations of the process used to manufacture the memory device. In particular, pitches of 2,4,8,16 are advantageous for reasons of decoding as will be evident from the following description. Each main wordline MWL0 to MWLn has associated with it a main wordline driver $50_0$ to $50_n$ which is a simple CMOS logic driver. This need drive only a straightforward CMOS level onto the main wordline. Each sub-wordline has associated with it a respective sub-wordline driver. These sub-wordline drivers are denoted $52_1, 52_2, 52_3$ and $52_4$ for the sub-wordlines SWL1 to SWL4 respectively. Each of these sub-wordline drivers $52_1$ to $52_4$ receives a CMOS logic level signal on line 53 from their associated main wordline driver $50_0$ to $50_n$ when that main wordline driver is driven. The sub-wordline drivers $52_1$ to $52_4$ also each receive a respective gate voltage signal $Vccxswl_1$ or $Vccxswl_2$ which is derived via multiplexors (not shown in FIG. 1) from a common supply voltage Vccx on line 54 from a gate voltage switch 12. Each sub-wordline driver $52_1$ to $52_4$ can be selected through a sub-wordline driver decode circuit 56. There is a sub-wordline decode circuit 56 associated with each sector of the array. The main wordline drivers $50_0$ to $50_n$ can be individually activated via a main wordline decode circuit 58. The main wordline decode circuit 58 receives a main wordline address 60. Each of the sub-wordline decode circuits 56 receives a sub-wordline address 62, the sub-wordline address 62 and the main wordline address 60 being derived from a row address 64. In the case where there are four sub-wordlines associated with each main wordline in the column direction, the sub-wordline address consists of two bits. These two bits are the two least significant bits of the row address. These are supplied to each sub-wordline decode circuit 56 on a two bit bus 66.

Each sub-wordline drive circuit thus receives address signals ADD from the sub-wordline decode circuit 56, and mainwordline MWL signals. It will be appreciated that the mainwordline MWL signals extend widthwise of the array and the ADD signals extend the full depth of the array.

Each sector of the array has associated with it a column decode circuit 68 to which the bit lines BL0 to BLp are connected. The column decode circuits 68 are responsive to a column address 70 to connect selected ones of the bit lines BL0 to BLp to each of a plurality of sense amplifiers 29 associated with each sector. This embodiment is an eight bit wide memory and there are eight sense amplifiers associated with each sector. Thus, eight bit lines are selected from the sector via the column decode circuit 68 in response to the column address 70, the bits from these cells are read by the sense amplifiers 29 and then supplied to an eight bit data bus 23. The sub-wordline decode circuit 56 is responsive to a sector enable code on bus 72 to generate a sector select signal SWL SELECT to enable that particular sector. The column decode circuits 68 are responsive to the sector select signal SWL SELECT so that those circuits of non-selected sectors are disabled. The sense amplifiers 29 in each sector each have associated with them a reference circuit 74 for supplying a reference current which is used during sensing. The reference circuit 74 is connected to a voltage Vccr on line 76 through a sector switch 78. That sector switch 78 is again responsive to the sector select signal SWL SELECT. As will readily be appreciated, the reference circuit 74 supplies its reference current to each of the sense amplifiers 29 in the respective sector. The bit lines BL0 to BLp can also selectively be connected through the column decode circuit 68 to a program load 32 in each sector for the purposes of programming the cells of the array.

The gate voltage Vccx output from the gate voltage switch 12 can have a plurality of different voltage levels as discussed in more detail in the following. In particular, for reading data from the cells a voltage of about 5 V is required on line 54. Where the memory chip is a 5 V part, that is with a power supply of 5 V±10%, the voltage Vccx can in that case be derived from the supply voltage itself. However, where the memory chip is a 3 V part, that is with a nominal supply voltage of 3.3 V±0.3 V it is necessary to boost the voltage on line 54 up to a level of about 5 V for reading. This is done via a voltage boost circuit 80 which includes as is known a boot capacitor 82 for providing the boosted voltage. Voltage boost circuits are known in the art and so further information will not be given herein. The voltage boost circuit is able to boost a supply voltage of 3.3 V±0.3 V to a level of about 5 V adequate for reading. A particularly suitable voltage boost circuit is described in our copending Application No. (Page White & Farrer Ref. 76218), the contents of which are herein incorporated by reference.

The voltage boost circuit 80 is activated in response to a boost signal BOOST on line 84.

The voltage level which can be achieved on line 54 is determined by the ratio of the size of the boot capacitor 82 to the amount of capacitance connected to line 54, the sub-wordline gate voltage signal line Vccxswl and the sub-wordline itself, i.e. the total capacitance which is boosted. If this boosted capacitance can be decreased, then the size of the boot capacitor 82 may be reduced for a given boosted voltage level on line 54. This gives advantages of a saving in chip area, a reduction in the time taken to boost the voltage level and reduction in power and on-chip noise generated by the boost circuit.

This is achieved with the circuits described herein by minimising the number of memory cells and sub-wordline drive circuits connected to line 54 so that the capacitance to be boosted is kept to a minimum when the voltage boost circuit 80 is active.

Figure 2:
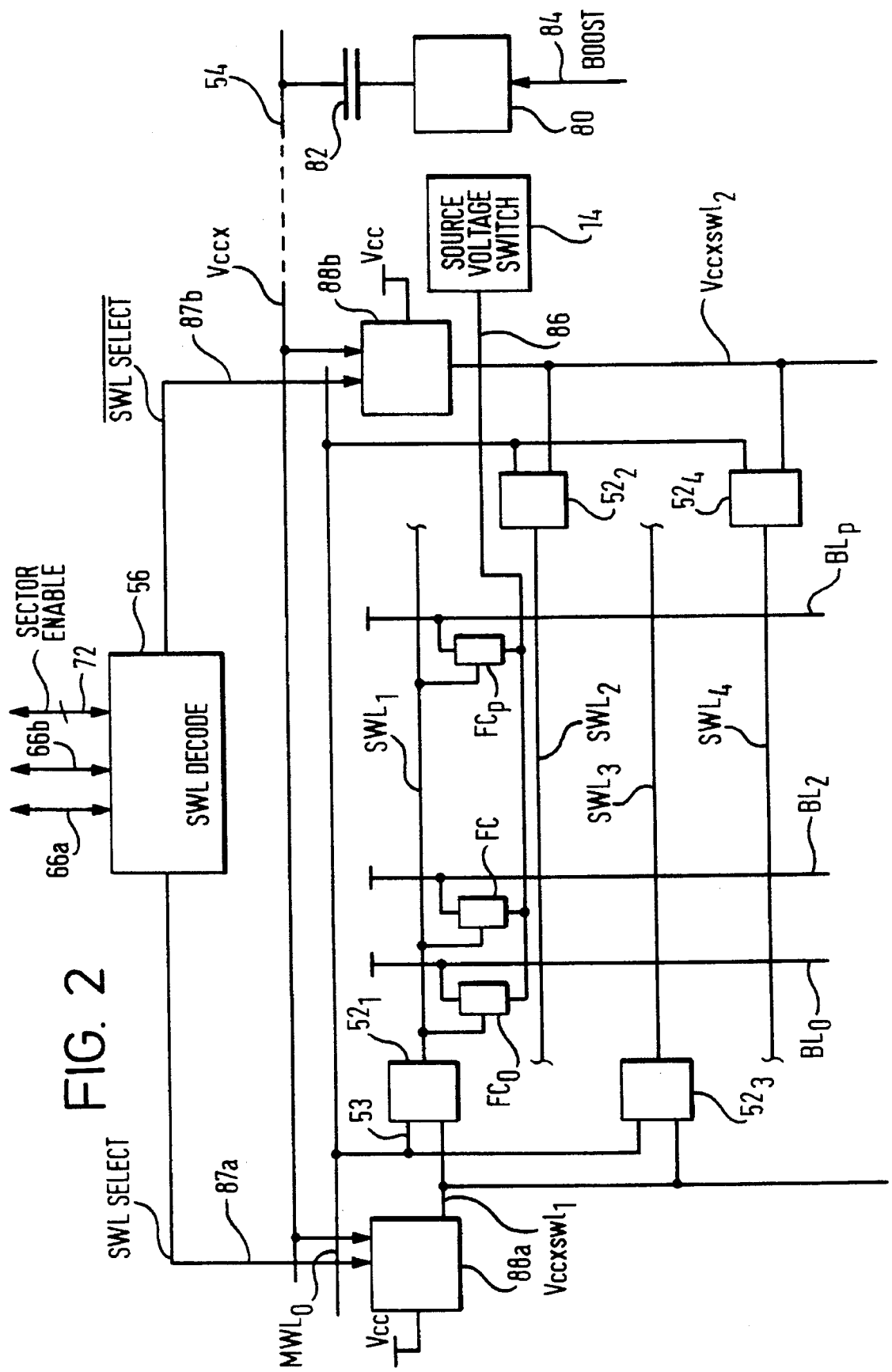
FIG. 2 is a schematic showing one sector of the array in a first embodiment.

One way in which this can be achieved is illustrated by the circuit of FIG. 2, which shows in more detail the first sector of the array and in particular the four sub-wordlines SWL1 to SWL4 associated with the main wordline MWL0. Each sub-wordline has a plurality p of flash memory cells FC0 to FCp connected to it. For reasons of clarity these are shown only for the sub-wordline SWL1 in FIG. 2. As described in more detail in the following, each flash cell FC comprises a floating gate transistor having its gate connected to the sub-wordline, its drain connected to the bit line BL0 to BLp respectively and its source connected to a voltage on line 86 from a source voltage switch 14. There are associated with each sector two control switches or multiplexors 88a,88b (which were not shown in FIG. 1 for reasons of clarity). The multiplexor 88a receives the voltage Vccx on line 54 and supplies that voltage, when activated, to the sub-wordline drivers $52_1$ and $52_3$ on the left hand side of the sector as Vccxswl$_1$. The multiplexor 88b receives the voltage Vccx on line 54 and, when activated, supplies that voltage to the sub-wordline drivers $52_2$ and $52_4$ on the right hand side of the sector as Vccxswl$_2$. It will be appreciated that if there are q sectors in the array there will be a total of 2q such signals Vccxswl. The multiplexors 88a and 88b are activated in response to the sector select signal SWL SELECT which is decoded from the sector enable code on bus 72 and whichever one of the bits of the two bit bus 66 is used to select between right and left hand sides of the sector. The two bit bus 66 comprises two address lines 66a,66b, each carrying a respective bit of the sub-wordline address. The first address line 66a carries the bit used to select between the group of sub-wordline drive circuits on either the right or the left hand sides of the sector. The second address line 66b carries the bit used to select between one of the two sub-wordline drivers on the side of the sector selected by the first address line 66a. The multiplexor 88a is connected to receive the signal SWL SELECT on line 87a and the multiplexor 88b is also connected to receive an SWL SELECT signal on line 87b. It will be appreciated that when the multiplexor 88a is selected the multiplexor 88b and the other multiplexor of the array are not selected. This ensures that when the multiplexor 88a is active for selection of the group of sub-wordline drivers on the left hand side of the sector, the multiplexor 88b is inactive. It will be clear that the sub-wordline decode circuit 56 is arranged to decode the address signals on lines 66a and 66b so that for the address line 66a in one state, the sub-wordline drivers on the same side of the sector are selected. The address lines ADD from the sub-wordline decode circuit 56 to the sub-wordline drivers are omitted from FIG. 2 for the sake of clarity.

The multiplexors 88a and 88b are such that when they are not activated, they hold the supply voltage Vccxswl$_1$, Vccxswl$_2$ of the non-selected sub-wordlines at the power supply voltage Vcc of the chip. In this way, the capacitance on the node to be raised is that of the selected sub-wordline, the load on Vccxswl$_1$ or Vccxswl$_2$ etc supplying the sub-wordline driver and the load on line 54 (Vccx). Details of the multiplexor are given later with reference to FIG. 6.

In the circuit of FIG. 2, the voltage boost circuit 80 is activated in response to the signal BOOST on line 84 which is applied for a 3 V part when the voltage Vccx is to be boosted from 3.3 V±0.3 V to about 5 V.

Reverting to FIG. 1, if the power supply voltage Vccx requires boosting for reading of the memory array, the voltage Vccr must also be boosted in the reference circuit 74 for the sense amplifiers 29 of the selected sector in order to bias the reference so that programmed and erased cells can be sensed. This is because a functional cell in the reference circuit 74 is used to generate the reference and hence must be biased in the same condition as the cells in the array. A similar principle can be used to route the boosted voltage Vccr only to the selected sector by the use of the sector reference switches 78, which selectively connect the voltage Vccr to the reference circuits 74 for enabled sectors in response to the SWL SELECT signal on line 87a derived from the sector decode circuit 56. This has the advantage of routing the boosted voltage only to required reference circuits (reducing the stress on reference cells in reference circuits of non-selected sectors) and reduces the capacitance on line 76, disabled sectors being held at 0 V, effectively disconnected from line 76.

In order to boost Vccr, Vccr is shorted to Vccx during 3 V read cycles by a boost short circuit 300 responsive to a READ-3 V signal as described in more detail later. The READ-3 V signal is active throughout read cycles when the part is configured to have a power supply voltage of 3.3 V, i.e. when boosting is likely to be required. When the signal Vccr is not required to be boosted, the boost short circuit 300 is disabled.

Figure 3:
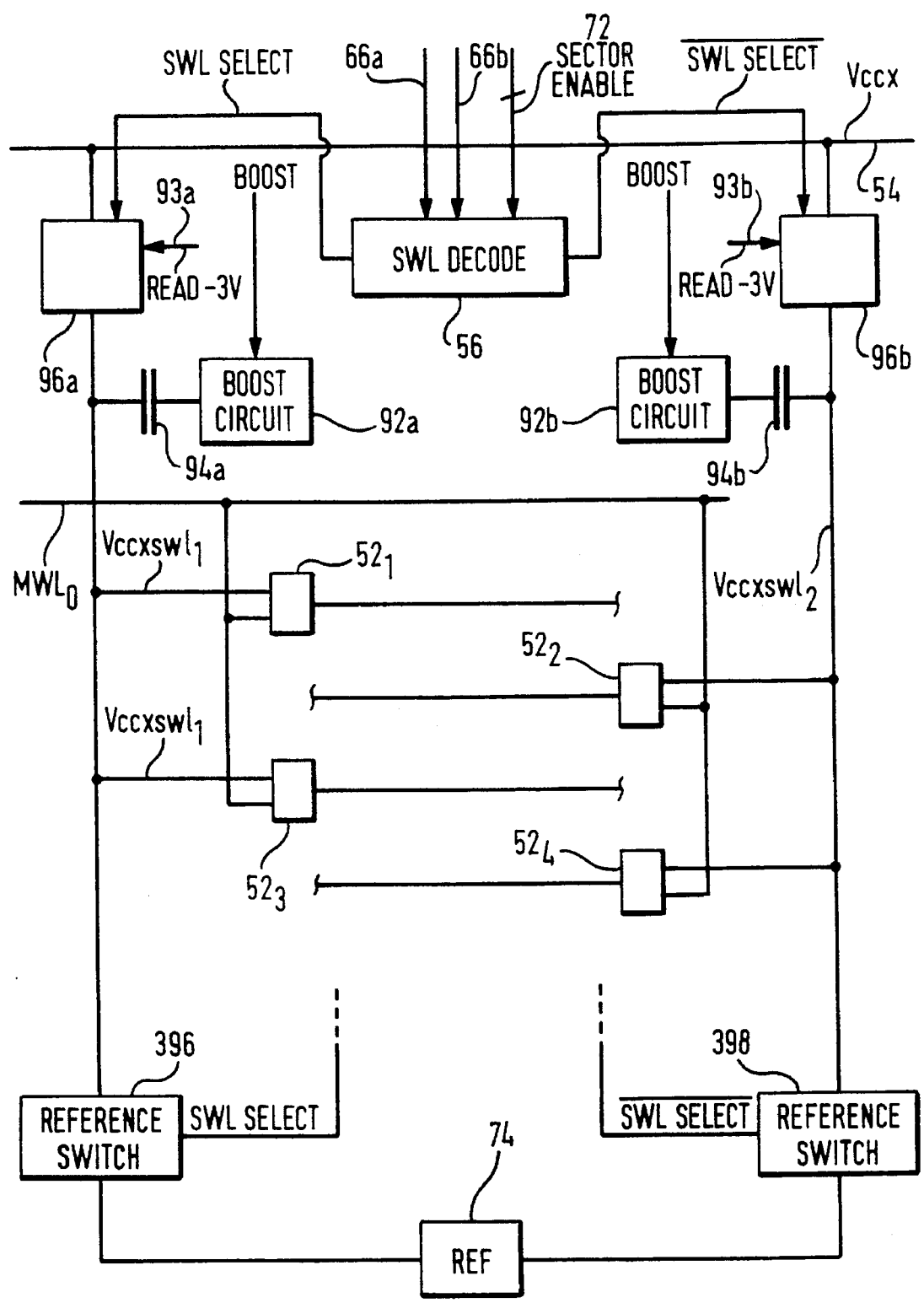
FIG. 3 is a schematic showing one sector of the array in a second embodiment.

In the circuit of FIG. 2, there is a common voltage boost circuit 80 and common boot capacitor 82. FIG. 3 shows an alternative and preferred arrangement which has two voltage boost circuits associated with each sector of the array. FIG. 3 is a simplified schematic diagram of one sector of the array showing the four sub-wordlines SWL1 to SWL4 associated with the main wordline MWL0 for the first sector of the array. The sub-wordline decode circuit 56 receives the address bits on address lines 66a and 66b and the SECTOR ENABLE bus 72 as for the circuit of FIG. 2. The sub-wordline drivers 52$_1$ to 52$_4$ are supplied with respective gate voltages Vccxswl$_1$, or Vccxswl$_2$ derived from the gate voltage Vccx on line 54. There is a voltage boost circuit 92a with a boot capacitor 94a associated with the left hand side of the sector. Similarly, there is a voltage boost circuit 92b and a boot capacitor 94b associated with the right hand side of the sector. Each sector of the array similarly has left and right hand side voltage boost circuits and associated boost capacitors. The gate voltage Vccx is selectively applied to the sub-wordline drivers via respective multiplexors 96a and 96b. These multiplexors 96a,96b receive the sector select signals SWL SELECT from the sector decode circuit 56 as in FIG. 2. The multiplexors also receive the READ-3V signal on lines 93a,93b respectively. The BOOST signal is selectively applied to activate the boost circuits 92a,92b. The BOOST signal can be decoded (by means not shown in FIG. 3) so that only the required boost circuit is active at any time. The READ-3 V signal is applied to all the multiplexors of the array in common and serves to isolate Vccx from all the signals Vccxswl$_1$, Vccxswl$_2$ etc in order to minimise the boosted capacitance.

This embodiment has the advantage that the load on Vccx line 54 is eliminated during boosting. Moreover, the boost time is reduced because the resistance of the multiplexor itself is no longer in the boost path: the boost capacitor is connected directly to the respective one of the Vccxswl$_1$, Vccxswl$_2$ etc nodes input to the sub-wordline driver.

Operation of the multiplexors 96a,96b is discussed later with reference to FIG. 9. The provision of individual voltage boost circuits and boot capacitors enables each boot capacitor to be much smaller. Likewise, the boost circuits themselves can be smaller. As with FIG. 2, the address lines ADD from the sub-wordline decode circuit 56 to the sub-wordline drivers 52$_1$ to 52$_4$ have been omitted for reasons of clarity.

The boost scheme described with reference to FIG. 3 needs to be further adapted to enable the boosting of the voltage supplied to the reference circuit 74 associated with a given sector. As the scheme of FIG. 3 only boosts the selected gate voltage Vccxswl$_1$ or Vccxswl$_2$ etc. within a sector the voltage Vccx is not boosted and hence the boost switch circuit 300 of FIG. 1 cannot be used. Referring to FIG. 3 reference switches 396 and 398 are provided for each side of the sector, connected between one of the respective gate voltages Vccxswl$_1$ and Vccxswl$_2$ and the reference circuit 74. When a sector is enabled one of the two reference switches 396 or 398 will be enabled by the signal SWL SELECT under the control of the SWL decode circuit 56 such that the one of the respective gate voltages Vccxswl$_1$ or Vccxswl$_2$ which is boosted will be connected to the reference circuit 74. When the voltage on the wordline is not required to be boosted (i.e. when the supply voltage Vcc is 5 V) one of the reference switches 396 or 398 can still be enabled to supply the Vcc level on either Vccxswl$_1$ or Vccxswl$_2$ to the reference circuit 74.

Figure 4:
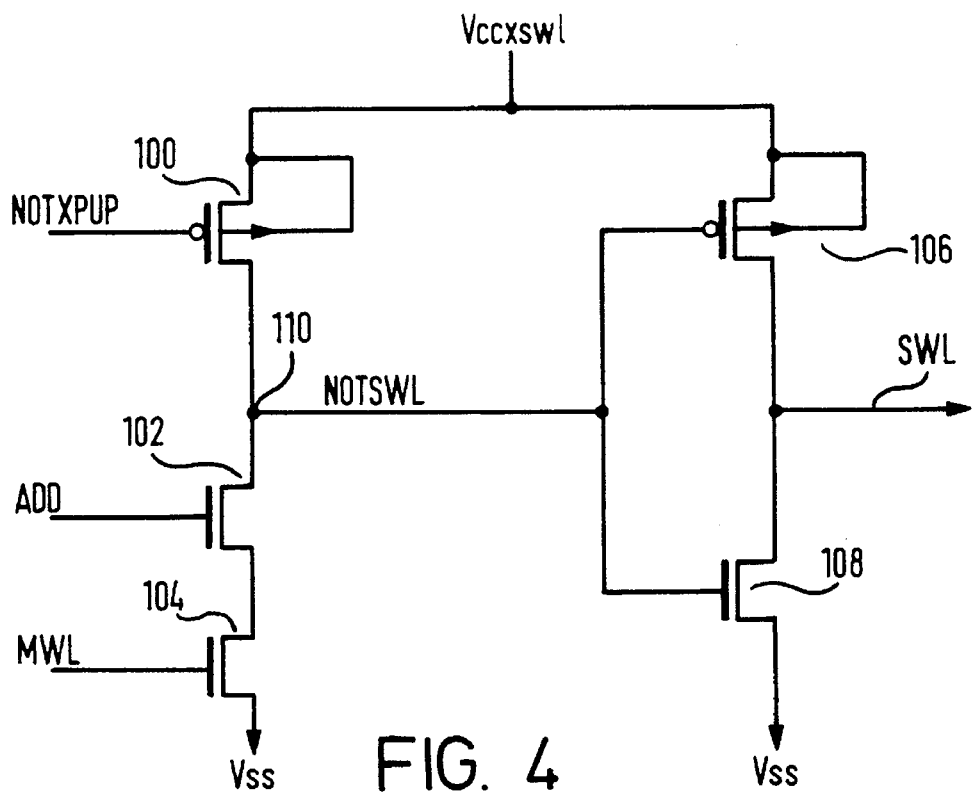
FIG. 4 is a transistor level diagram of a sub-wordline driver.

Another advantage of the circuits described above is that the sub-wordline drivers can be simple circuits. An exemplary circuit for a sub-wordline driver is shown in FIG. 4. The sub-wordline driver comprises a p-channel pull-up transistor 100 and first and second n-channel pull-down transistors 102 and 104 which are connected in series between the voltage Vccxswl supplied to the sub-wordline driver and a reference voltage Vss such as ground.

During programming cycles with 12 V on any one of the signals Vccxswl$_1$, Vccxswl$_2$ etc the first and second series n-channel devices are not strong enough to pull down against the pull-up device 100 if its gate is at zero. The n-channel devices could be made stronger but would then use up more area, which is not desirable. The p-channel pull-up transistor 100 thus receives on its gate a signal NOTXPUP which serves to alter the strength of the pull-up device 100. For reading, the signal XPUP is held at 0 V so that the pull-up transistor 100 is fully on. If desired, however the strength of the pull-up device could be changed during reading by altering the level of the signal XPUP as for programming. This is because a 'sneak' path exists through the p-channel transistor 100 of the selected sub-wordline driver which slowly discharges the boosted capacitance. Reducing the strength of this pull-up device in turn reduces the rate of this discharge. The first n-channel pull-down transistor 102 receives at its gate the address signal ADD from the sub-wordline decode circuit selecting that particular sub-wordline driver. This signal ADD is a CMOS level signal. The second n-channel pull-down transistor 104 receives on its gate the CMOS level from the main wordline driver and this is denoted MWL in FIG. 4. An inverter comprising a p-channel device 106 and an n-channel device 108 connected in series between the voltage Vccxswl and the reference voltage Vss has an input NOTSWL on a node 110 between the p-channel pull-up transistor and the first n-channel pull-down transistor, the output of which is the sub-wordline itself SWL. It will be noted that in the circuit of FIG. 4 the p-channel pull-up transistor 100 and p-channel transistor 106 of the inverter have their sources connected to Vccxswl. This is so that the input node 110 to the inverter is pulled up to Vccswl and so fully turn off the p-channel transistor 106 in the sub-wordline drivers of unselected sub-wordlines. Otherwise the boosted voltage will be severely degraded.

Figure 5:
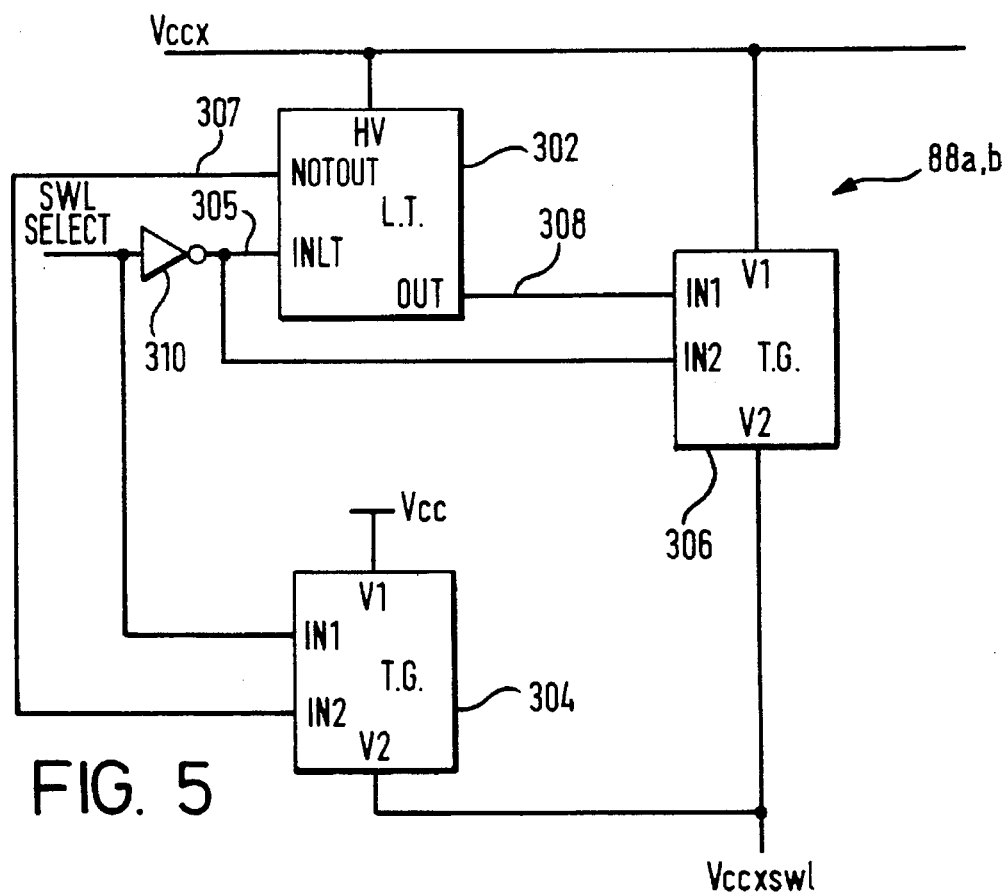
FIG. 5 is a block diagram of a control switch for the first embodiment of the invention.

Reference will now be made to FIG. 5 to describe the multiplexors 88a,88b of the first embodiment of the invention illustrated in FIG. 2. Each muliplexor comprises a level translator 302 and first and second transmission gates 304, 306. The first transmission gate 304 is connected between Vcc and Vccxswl. The second transmission gate 306 is connected between Vccx and Vccxswl. Vccxswl could be either Vccxswl$_1$, or Vccxswl$_2$ here as appropriate. The level translator 302 has an input 305 and first and second outputs 307,308. The first output 307 controls the first transmission gate 304 and the second output 308 controls the second transmission gate 306. The first transmission gate 304 also receives an input from the SWL SELECT line. The second transmission gate 306 also receives as an input on line 305 the SWL SELECT signal inverted via an inverter 310. The multiplexor of FIG. 5 operates so that when the signal SWL SELECT is high, the level translator 302 provides a low signal on output 308 and a high signal on output 307. The low signal on line 308 causes the second transmission gate 306 to connect the voltage Vccxswl to line Vccx. The high signal on output 307 causes the first transmission gate 304 to disconnect line Vccxswl from Vcc. In contrast, when the signal SWL SELECT goes low, the first transmission gate 304 connects node Vccxswl to the power supply voltage Vcc and the second transmission gate 306 disconnects line Vccxswl from Vccx. Thus, for non-activated control switches the voltages Vccxswl$_1$, Vccxswl$_2$ etc are held at Vcc. (Sub-wordlines in a deselected sector are held at 0 V by the sub-wordline driver circuit of FIG. 4.)

The following truth table for FIG. 5 demonstrates this clearly.

| SWL SELECT | Vccxswl |
|---|---|
| 0 | Vcc |
| 1 | Vccx (Boost) |

Thus, if a sector is not selected, Vccxswl is at Vcc. In any other cycle the voltage on Vccx, for example 12 V during a program operation, is multiplexed onto Vccxswl.

Figure 6:
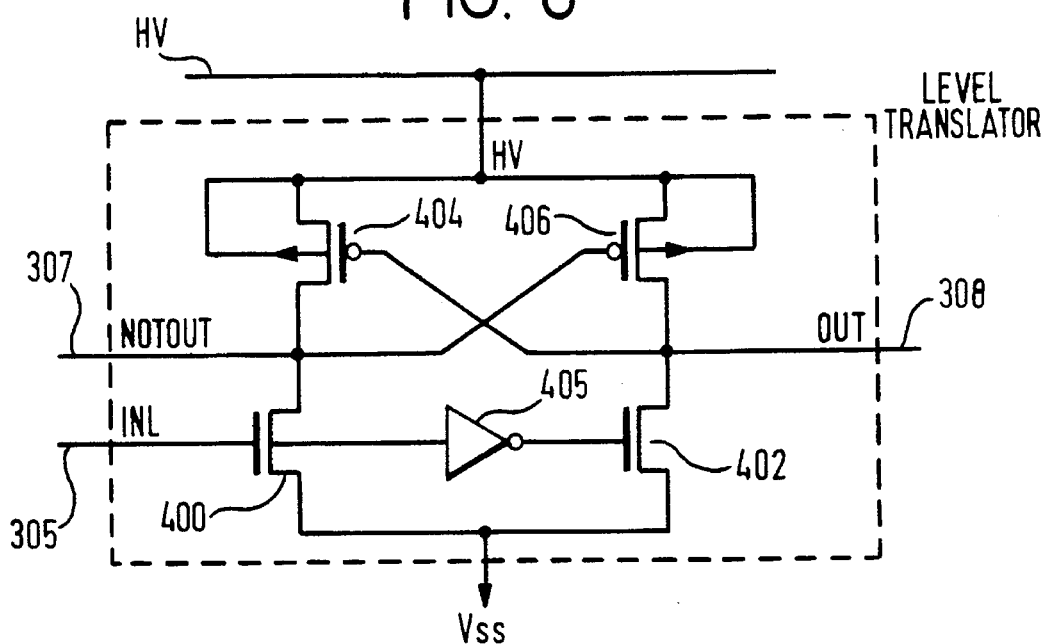
FIG. 6 is a transistor level diagram of level translators used in the circuits of FIGS. 5, 8 and 9.

FIG. 6 is a transistor level diagram of the level translator 302 of FIG. 5. The same circuit provides the level translators 312,314 in FIG. 8 and 320,322 and 324 of FIG. 9. The reference numerals in FIG. 6 however correspond to those used in FIG. 5. The level translator circuit comprises first and second input transistors 400,402. The first input transistor 400 receives the input signal 305 to the level translator and the second input transistor 402 receives an inverted version of that signal via an inverter 405. The level translator also includes first and second cross-coupled p-channel transistors 404,406. Complementary outputs from the level translator are taken from nodes 308 and 307 between each cross-coupled transistor and its respective input transistor.

The level translator translates CMOS level signals on the input signal 305 to signals at the output nodes 307 and 308 the levels of which are determined by a voltage level HV supplying the level translator circuit. The translated signals can then be used to control circuits that are powered by non-CMOS level supplies, e.g. Vpp (12 V) or boost levels. The cross-coupled p-channel transistors 404 and 406 ensure zero dc current in the stable state. The advantage of the symmetrical circuit is to provide complementary translated circuit levels.

Figure 7:
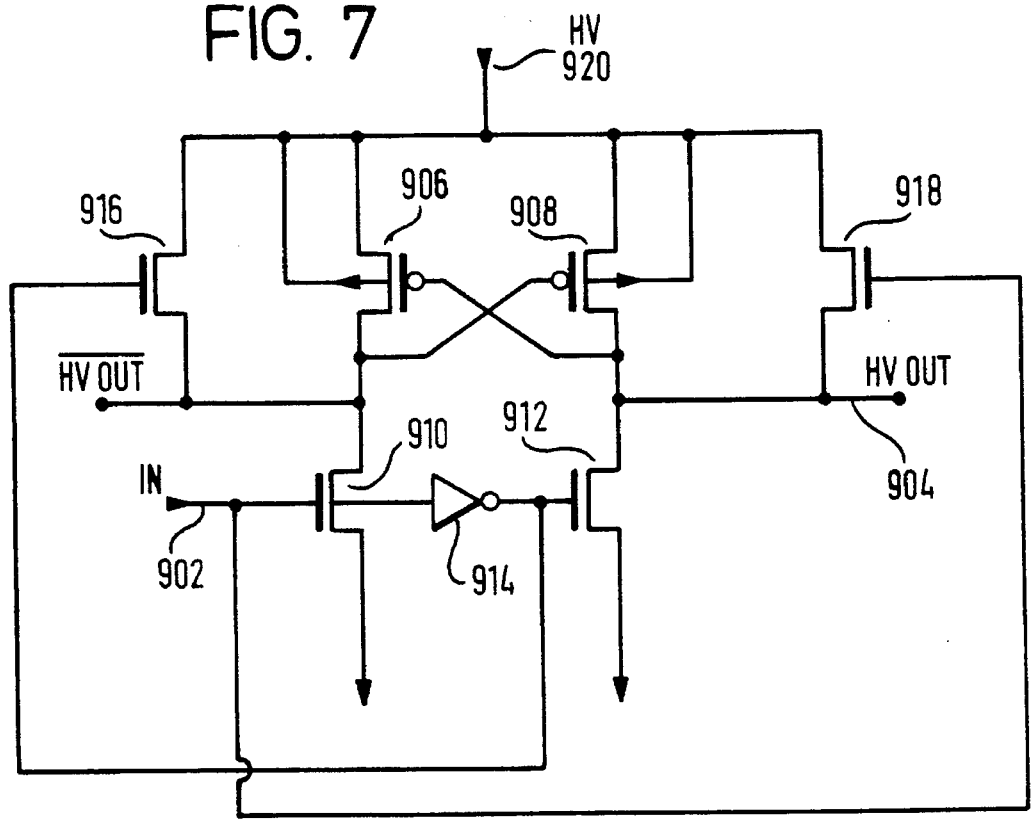
FIG. 7 is a transistor level diagram of a sector reference switch.

Reference will now be made to FIG. 7 to describe operation of a sector reference switch 78. This circuit routes the reference level to the reference circuits and is a small variation on the level translator of FIG. 6. If there are four reference circuits then three of the four switches will have 0 V on the input node 902 which is connected to the sector select signal SWL SELECT and so the output node 904 HVOUT will also be 0 V and so the reference circuits will be disabled. The selected switch will have say 5 V on node 902 and 5 V on HVOUT node 904 which is connected to the reference circuit or, in the boosted case, 3 V on node 902 and the boosted level (5 V) on HVOUT node 904 and hence the need for the level translator constituted by transistors 906, 908,910,912 and inverter 914. The addition of two n-channel transistors 916,918 in parallel with the p-channel cross-coupled transistors is for the reason of passing low voltages from HV to HVOUT. This may be required when programming or characterising the reference cells.

Figure 8:
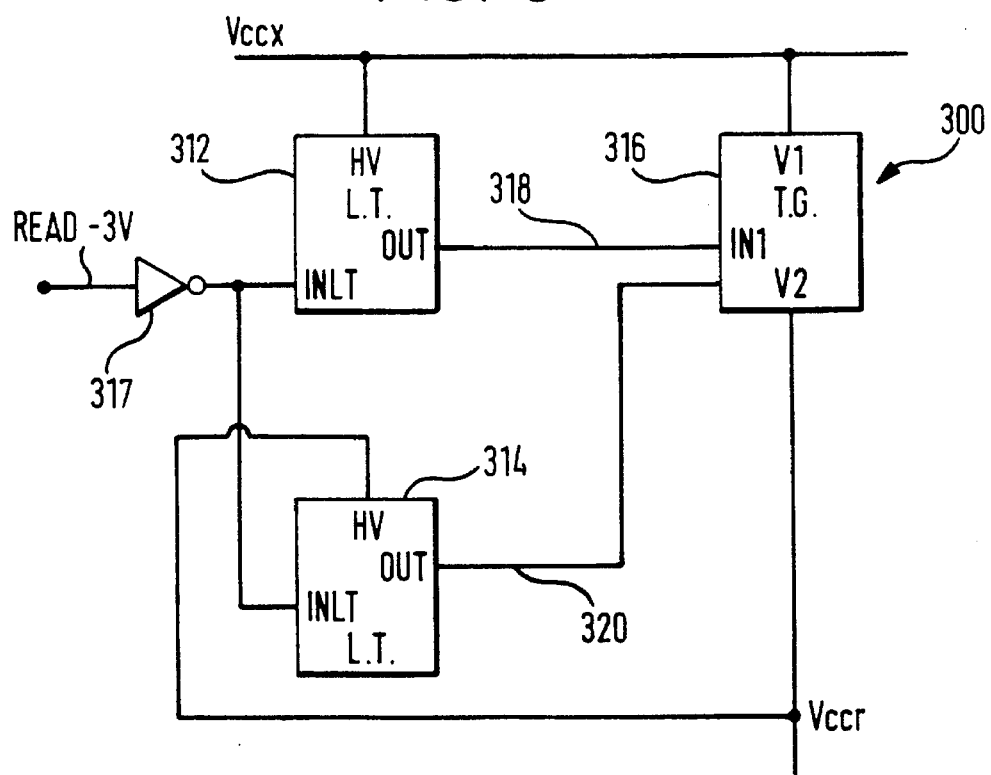
FIG. 8 is a block diagram of a boost short circuit switch.

Reference will now be made to FIG. 8 to describe the boost short circuit 300. The boost short circuit 300 comprises first and second level translators 312,314 the outputs of which control a transmission gate 316. The transmission gate 316 is connected between Vccx and Vccr. The first and second level translators 312,314 receive an inverted version of the READ-3 V signal via an inverter 317. When the READ-3 V signal is high, the outputs on lines 318 and 320 respectively of the first and second level translators 312,314 go low and cause the transmission gate 316 to connect line Vccr to Vccx. When the READ-3 V signal is low, high outputs on lines 318 and 320 cause the transmission gate 316 to disconnect line Vccr from Vccx. Vccr is then driven from some other source such as Vcc.

Reference will now be made to FIG. 9 to describe the multiplexors 96a,96b of the second embodiment of FIG. 3. The multiplexor 96a,b comprises first, second and third level translators 320,322,324. The circuit also comprises first and second transmission gates 326,328. The first transmission gate 326 is connected between Vccx and Vccxswl. The second transmission gate 328 is connected between Vcc and Vccxswl. The first transmission gate 326 is controlled by the output from the first level translator 320 on line 330 and the output on line 332 from the second level translator 322. The second transmission gate 328 is controlled by the SWL SELECT signal on line 334 and the output from the third level translator 324 on line 336. The first and second level translators receive as their input the output 338 of a NAND gate 340. The NAND gate 340 receives as its inputs the inverse of the READ-3 V signal on line 93 via an inverter 339, and the SWL SELECT signal. The third level translator 324 receives as an input the SWL SELECT signal on line 342. When the SWL SELECT signal is low, indicating that the control circuit is inactive, the low signal on line 334 and the low signal on line 336 from the level translator 324 cause the transmission gate 328 to connect line Vccswl to Vcc. When the SWL SELECT signal is low, the output of the NAND gate on line 338 will be high, which forces high signals on lines 330 and 332. Therefore, the first transmission gate 326 disconnects line Vccxswl from Vccx When the signal SWL SELECT is high, the transmission gate 328 disconnects line Vccxswl from Vcc. The line Vccxswl can therefore be connected to Vccx or boosted in dependence on the state of the READ-3 V signal on line 93. If that signal is high, the high outputs on lines 330 and 332 will cause the transmission gate 326 to disconnect line Vccxswl from line Vccx to allow the node Vccxswl to be boosted. If the READ-3 V signal on line 93 is low while the signal SWL SELECT is high however, low outputs on lines 330 and 332 will cause transmission gate 326 to connect line Vccxswl to Vccx.

The following table indicates the operation of the circuit of FIG. 9.

| SELECT | READ-3V | Vccx_SWL |
|---|---|---|
| 0 | 0 | VCC |
| 0 | 1 | VCC |
| 1 | 0 | Vccx |
| 1 | 1 | (BOOST) |

Thus, operation is the same as for FIG. 5 except if READ-3 V is active (HIGH), then in the selected sector Vccxswl is isolated and boosted. For other cycles such as program the 12 V on Vccx is multiplexed onto Vccxswl as above.

Figure 10:
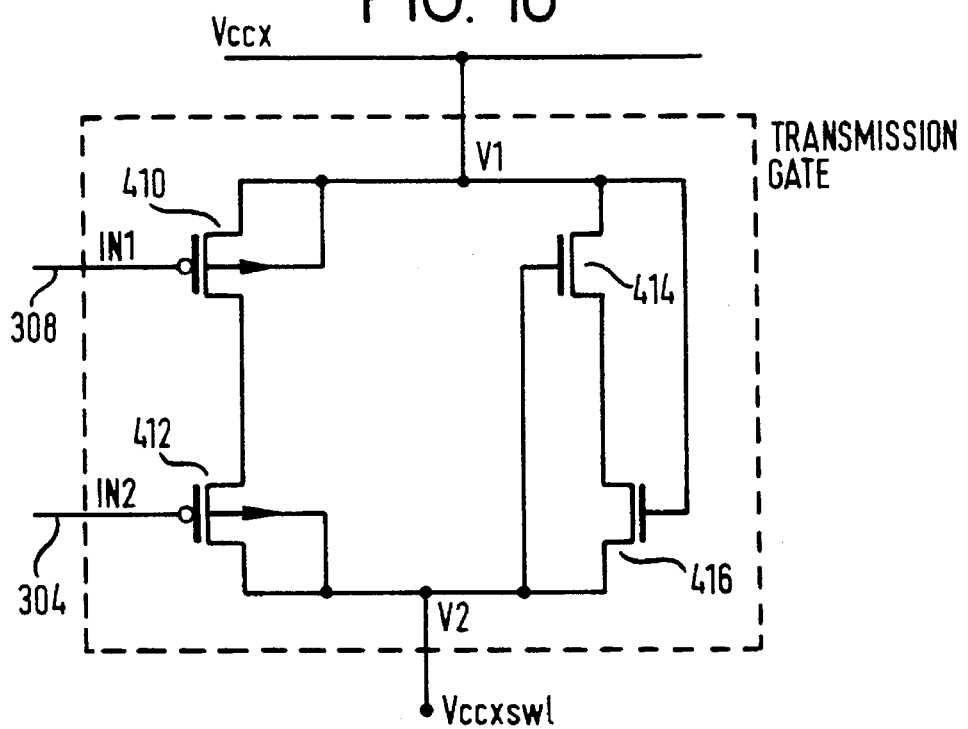
FIG. 10 is a transistor diagram of transmission gates used in the circuits of FIGS. 5, 8 and 9.

FIG. 10 is a transistor level diagram of the transmission gate 306 shown in FIG. 5. The same transmission gate structure is used as the transmission gate 316 in FIG. 8 and the transmission gates 326,328 in FIG. 9. The transmission gate comprises first and second input transistors 410,412 which are both p-channel transistors receiving the inputs 308,304 at their gates. The input transistors are connected in series between the line Vccx and line Vccxswl. Other transmission gates may be connected between different signal lines as appropriate, the circuit of FIG. 10 illustrating the transmission gate 306 only. The transmission gate also includes complementary n-channel transistors 414,416 which are also connected in series between Vccx and Vccxswl.

The way this works is that the pass gate mechanism is the two p-channel transistors 410,412 connected with their bulk connections connected to Vccx and Vccxswl. This is so that Vccx and Vccxswl can be at any two different voltage levels without any forward-bias condition on the source to bulk junctions that would discharge Vccx or Vccxswl. The two n-channel transistors 414,416 are used to bias the common node of the p-channel transistors 410,412 to whichever is the lower voltage of Vccx and Vccxswl, thus ensuring correct biasing.

Figure 11:
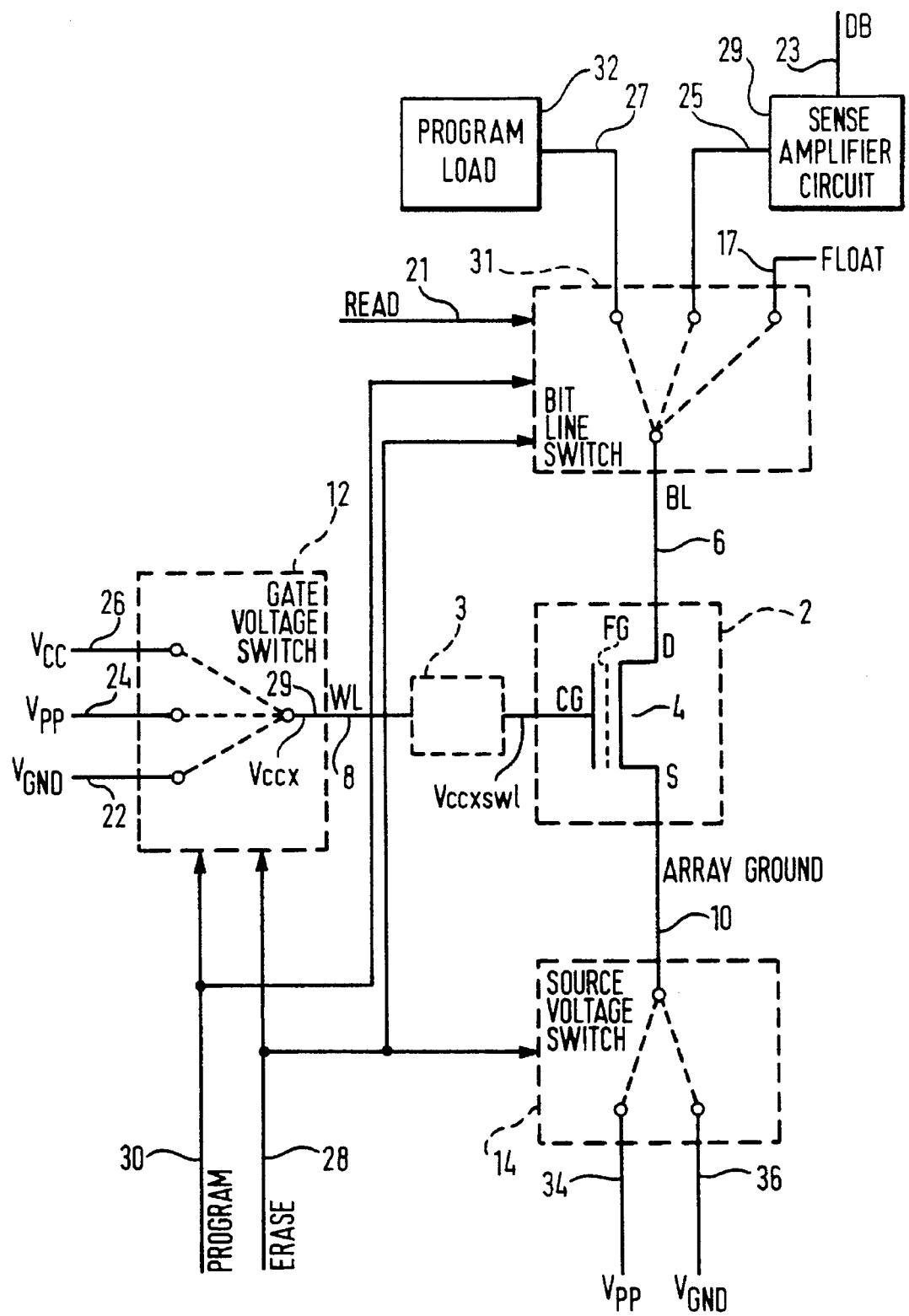
FIG. 11 is a schematic diagram illustrating operation of a flash memory cell.

Reference will finally be made to FIG. 11 to describe the basic operation of each flash memory cell FC. Each flash memory cell comprises a single floating gate transistor 4 having a control gate CG, a floating gate FG, a source S and a drain D. The source S of the floating gate transistor 4 is connected to an ARRAY GROUND signal on line 10. Through the source voltage switch 14 this line 10 can be at a ground voltage VGND or a high voltage Vpp. Voltage Vpp represents a programming potential (typically 12 V) and voltage VGND represents device ground. The source voltage switch 14 is connected to the voltage Vpp via line 34 and the voltage VGND via line 36. The control gate CG of the floating gate transistor 4 is connected to the gate voltage switch 12 through the main wordline and sub-wordline decode circuitry discussed above and denoted schematically by block 3. Thus, the control gate receives the voltage Vccswl. The gate voltage switch supplies voltage Vccx which can be derived from the power supply voltage Vcc, the programming voltage Vpp or VGND on lines 26,24 and 22 respectively. The switches 12 and 14 each receive a control signal ERASE on line 28 and additionally the gate voltage switch 12 receives a control signal program on line 30. The drain D of the floating gate transistor 4 is connected to the bit line BL which itself can be connected to the program load 32, a sense amplifier 29, or a floating connection FLOAT on line 17 through a bit line switch circuit 31.

The flash memory has three primary modes of operation: program, erase and read. Each of these modes will be described hereinafter with reference to FIG. 1. It will be understood by a person skilled in the art that several other modes of operation, such as program verify for example, also exist. However, the present description is by way of background illustration only and therefore only these three modes will be described. The program mode involves writing a "0" to a memory cell or group of memory cells, the erase mode involves removing a "0" from any cell that has a "0" stored in it such that the cells all effectively store "1"s, and the read mode involves reading a cell to establish whether it is programmed or erased, i.e. contains either a "0" or a "1".

During a program mode, the control signal PROGRAM on line 30 is set such that the gate voltage switch 12 is configured to connect the voltage Vpp on line 24 to the control gate CG of transistor 4 via word line 8. As the control signal ERASE on line 28 is not set the source voltage switch 14 is configured to connect the voltage VGND on line 36 to the source of transistor 4 via the ARRAY GROUND signal line The bit line switch 31 is set such that the bit line on line 6 is connected to the program load 32 by line 27. The program load 32 is such that a voltage of between 4 and 8 V is on the drain D of the transistor 4 via the bit line 6. As a result of these signals applied to the transistor 4 the floating gate FG becomes negatively charged. The negative charge increases the threshold voltage of the floating gate transistor making it less conductive. The amount of negative charge accumulated at the floating gate depends on several factors, including the duration for which the control signal PROGRAM is set, the voltages applied to the gate and drain terminals, and the thickness of the oxide separating the floating gate from the channel of the transistor. Furthermore, as the cell is programmed the accumulation of negative charge on the floating gate causes the electric field across the field oxide to reduce such that a point is reached where no more negative charge is attracted to the floating gate such that the threshold voltage of the floating gate transistor saturates to a limit. In this way, a "0" is written into the cell. Normally, several program pulses may be needed, each pulse being followed by a verify cycle.

During an erase mode, the control signal ERASE on line 28 is set such that the gate voltage switch 12 is configured to connect the voltage VGND on line 22 to the control gate CG of the transistor 4 via the word line 8, and such that the switch 14 is configured to connect the voltage Vpp on line 34 to the source S of the transistor 4 via the ARRAY GROUND line 10. The bit line switch 31 is set such that the bit line 6 is connected to the floating connection FLOAT on line 17 so that it floats. As the floating gate transistor is fabricated such that the source region in the substrate underlies the floating gate, any negative charge on the floating gate will be reduced. The amount of negative charge removed from the floating gate FG depends on the various factors as discussed hereinabove with reference to a program operation. The reduction of negative charge reduces the threshold voltage of the floating gate transistor making it more conductive. In this way the state of the cell is restored to "1". Normally, several erase pulses may be required, each erase pulse being followed by a verify cycle.

During a read mode, neither the control signal ERASE on line 28 nor the control signal PROGRAM on line 30 are set, but the READ signal on line 21 is set. The Vcc signal on line 26 is connected by the source voltage switch 12 to the control gate of the transistor 4 via the line Vccx and the word line 8. If the device is a 3 V part, the supply voltage Vcc is disconnected from the signal Vccx, and hence the wordline WL 8, is boosted above Vcc by means not shown. The voltage VGND on line 36 is connected to the source of the transistor 4 via the ARRAY GROUND signal line 10. The bit line 6 is biased to approximately 1 volt during a read operation by means (discussed later) within the sense amplifying circuit. During a read operation, for an erased cell (with "1" stored in it) the conductivity of the cell is such that current passes through the cell when the bit line is connected for sensing. For a programmed cell (with a "0" stored in it) substantially no current is passed by the cell.

The current passed (or not) by the cell is compared with a reference current to detect the status of the cell.

What is claimed is:

1. An integrated circuit memory device comprising:
   a memory array comprising a plurality of memory cells arranged in rows and columns, the cells in a row being arranged in sectors with cells in each sector being connected to a common respective sub-wordline and cells in a column being connected to a common bit line;
   a plurality of sub-wordline drive circuits associated respectively with said sub-wordlines and connected to supply a cell voltage to their associated sub-wordline;
   voltage raising circuitry for raising a power supply voltage connected on a memory voltage supply line to said cell voltage;
   row addressing circuitry for selecting one of the sub-wordlines in one of said sectors; and
   control circuitry for selectively disconnecting at least some of said sub-wordline drive circuits associated with non-selected sub-wordlines from said memory voltage supply line.

2. An integrated circuit memory device according to claim 1 wherein said control circuitry comprises a plurality of voltage control switches, each voltage control switch being associated with a group of sub-wordline drive circuits for applying said cell voltage to a group of sub-wordline drive circuits when a sub-wordline associated with a sub-wordline drive circuit in that group is selected.

3. An integrated circuit memory device according to claim 2 wherein each voltage control switch is responsive to a sector enable signal so that it can be disabled when the sub-wordline drive circuits associated with that voltage switch are not selected.

4. An integrated circuit memory device according to claim 1 which comprises a plurality of main wordlines extending in the row direction, each main wordline being connected to a plurality of sub-wordline drive circuits in the column direction.

5. An integrated circuit memory device according to claim 4 wherein said row addressing circuitry comprises a main wordline decode circuit for selecting one of said plurality of main wordlines and a sub-wordline decode circuit for selecting one of said sub-wordline drive circuits connected to said selected main wordline.

6. An integrated circuit memory device according to claim 5 which comprises a plurality of said sub-wordline decode circuits associated respectively with said sectors of cells.

7. An integrated circuit memory device according to claim 4 wherein the sub-wordline drive circuit connected to each main wordline and extending in the column direction are arranged in an interleaved fashion with sub-wordline drive circuits associated with alternate sub-wordlines being located on opposite sides of said sector of cells.

8. An integrated circuit memory device according to claim 7 wherein said control circuitry comprises a plurality of voltage control switches, each voltage control switch being associated with a group of sub-wordline drive circuits for applying said cell voltage to a group of sub-wordline drive circuits when a sub-wordline associated with a sub-wordline driver circuit in that group is selected, and wherein there is a voltage control switch associated with the sub-wordline drive circuits on each side of said sector of cells.

9. An integrated circuit memory device according to claim 1 or 2 wherein said voltage raising circuitry comprises a voltage boost circuit and a boost capacitor connected between said voltage boost circuit and the common memory voltage supply line which is connected between said power supply voltage terminal and said control circuitry so that when said voltage boost circuit is active, the boost capacitor increases the voltage on said memory voltage supply line above the power supply voltage.

10. An integrated circuit memory device according to claim 1 or 2 wherein said voltage raising circuitry comprises a plurality of voltage boost circuits and associated boost capacitors, wherein each sector of cells has associated therewith at least one voltage boost circuit and a boost capacitor, said boost capacitor being connected between its voltage boost circuit and a group of sub-wordline drive circuits of said sector, said control circuitry being operative to connect the power supply voltage to said boost capacitor thereby to permit said boost capacitor of selected sectors to supply said cell voltage to a sub-wordline drive circuit of a selected sub-wordline.

11. An integrated circuit memory device according to claim 1 wherein the bit lines associated with each sector of cells are connected to a respective column decode circuit for that sector, said column decode circuit being activated in response to a sector enable signal.

12. An integrated circuit memory device according to claim 11 which comprises for each sector a plurality of sense amplifiers, the column decode circuit for each sector being responsive to a column address to selectively connect bit lines of the sector to said sense amplifiers, said sense amplifiers receiving a reference current from a reference circuit associated with the sector.

13. An integrated circuit memory device according to claim 12 which comprises a plurality of sector switches associated with each sector for selectively applying a boosted power supply voltage to said reference circuits.

14. An integrated circuit memory device according to claim 1 wherein each sub-wordline drive circuit comprises a pull-up device and a pull-down device connected in series between said cell voltage and a reference voltage, and an inverter connected between a node between said pull-up and said pull-down devices and the sub-wordline associated with the sub-wordline drive circuit.

15. An integrated circuit memory device according to claim 14 wherein said inverter comprises a p-channel drive transistor and an n-channel drive transistor connected in series between said cell voltage and said reference voltage.

16. An integrated circuit memory device according to claim 14 or 15 which comprises a plurality of main wordlines extending in the row direction, each main wordline being connected to a plurality of sub-wordline drive circuits in the column direction;

wherein said row addressing circuitry comprises the main wordline decode circuit for selecting one of said plurality of main wordlines and a plurality of sub-wordline decode circuits associated respectively with said sectors of cells for selecting one of said sub-wordline drive circuits connected to said selected main wordline;

and which further comprises a further pull-down device connected in series between said pull-up device and said first mentioned pull-down device, the first mentioned pull-down device being controllable in response to a selection signal from said sub-wordline addressing circuitry and said further pull-down device being responsive to a main wordline select signal from said main wordline addressing circuitry.

17. An integrated circuit memory device comprising:

a memory array comprising a plurality of memory cells arranged in rows and columns, the cells in a row being arranged in sectors with cells in each sector being connected to a common respective sub-wordline and cells in a column being connected to a common bit line;

a plurality of sub-wordline drive circuits associated respectively with said sub-wordlines and connected to supply a cell voltage to their associated sub-wordline;

voltage raising circuitry for raising a power supply voltage connected on a memory voltage supply line to said cell voltage;

row addressing circuitry for selecting one of the sub-wordlines in one of said sectors;

control circuitry for selectively disconnecting least some of said sub-wordline drive circuits associated with non-selected sub-wordlines from said memory voltage supply line;

a plurality of main wordlines extending in the row direction, each main wordline being connected to a plurality of sub-wordline drive circuits in the column direction;

wherein said row addressing circuitry comprises the main wordline decode circuit for selecting one of said plurality of main wordlines and a plurality of sub-wordline decode circuits associated respectively with said sectors of cells for selecting one of said sub-wordline drive circuits connected to said selected main wordline; and wherein the sub-wordline drive circuit connected to each main wordline and extended in the column direction are arranged in an interleaved fashion with said sub-wordline drive circuits associated with alternate sub-wordlines being located on opposite sides of said sector of cells.

* * * * *